United States Patent
Yang et al.

(10) Patent No.: US 11,133,039 B2
(45) Date of Patent: Sep. 28, 2021

(54) POWER SWITCH CONTROL IN A MEMORY DEVICE

(71) Applicant: Taiwan Semiconductor Manufacturing Company, Ltd., Hsinchu (TW)

(72) Inventors: Hao-I Yang, Hsinchu (TW); Cheng Hung Lee, Hsinchu (TW); Chen-Lin Yang, Hsinchu (TW); Yu-Hao Hsu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 29 days.

(21) Appl. No.: 16/594,779

(22) Filed: Oct. 7, 2019

(65) Prior Publication Data

US 2020/0118602 A1    Apr. 16, 2020

Related U.S. Application Data

(60) Provisional application No. 62/744,951, filed on Oct. 12, 2018.

(51) Int. Cl.
*G11C 5/14* (2006.01)
*G11C 11/417* (2006.01)

(52) U.S. Cl.
CPC .......... *G11C 5/148* (2013.01); *G11C 11/417* (2013.01)

(58) Field of Classification Search
CPC .............................. G11C 5/148; G11C 11/417
USPC ........................................................ 365/226
See application file for complete search history.

(56) References Cited

U.S. PATENT DOCUMENTS

| | | | | |
|---|---|---|---|---|
| 8,885,434 B2* | 11/2014 | Kumar | .................. | G11C 5/147 365/226 |
| 2005/0128852 A1* | 6/2005 | Deng | .................... | G11C 11/413 365/226 |
| 2008/0186795 A1* | 8/2008 | Lih | ........................ | G11C 11/417 365/228 |
| 2008/0272809 A1* | 11/2008 | Idgunji | .............. | H03K 19/0016 327/78 |
| 2009/0039952 A1 | 2/2009 | Wang et al. | | |
| 2010/0214863 A1* | 8/2010 | Chan | ...................... | G11C 5/147 365/228 |

(Continued)

FOREIGN PATENT DOCUMENTS

KR    10-2016-0046155 A    4/2016

*Primary Examiner* — Sung Il Cho
(74) *Attorney, Agent, or Firm* — Merchant & Gould P.C.

(57) ABSTRACT

A power switch control circuit includes a supply rail configured to supply power to a memory array. A first header switch couples the supply rail to a first power supply that corresponds to a first power domain. A second header switch couples the supply rail to a second power supply that corresponds to a second power domain. A control circuit is configured to receive a select signal and a shutdown signal, and to output control signals to the first and second header switches to selectively couple the first and second header switches to the first and second power supplies, respectively, in response to the select signal and the shutdown signal. The control circuit is configured to output the control signals to the first and second header switches to disconnect both the first and second header switches from the first and second power supplies in response to the shutdown signal and irrespective of the select signal.

20 Claims, 11 Drawing Sheets

(56) References Cited

U.S. PATENT DOCUMENTS

| | | | | |
|---|---|---|---|---|
| 2010/0254209 A1* | 10/2010 | Lee | ............... | G11C 5/063 |
| | | | | 365/226 |
| 2011/0181343 A1* | 7/2011 | Myers | ............... | G06F 30/39 |
| | | | | 327/427 |
| 2011/0248759 A1* | 10/2011 | Chi | ............... | H03K 3/356156 |
| | | | | 327/202 |
| 2012/0013319 A1* | 1/2012 | Patil | ............... | G11C 5/148 |
| | | | | 323/282 |
| 2012/0287736 A1* | 11/2012 | Cheng | ............... | G11C 29/021 |
| | | | | 365/194 |
| 2015/0048869 A1* | 2/2015 | Huang | ............... | G06F 1/3287 |
| | | | | 327/143 |
| 2017/0178719 A1* | 6/2017 | Wu | ............... | G11C 11/419 |

\* cited by examiner

POWER SWITCH CONTROL IN A MEMORY DEVICE

CROSS-REFERENCE TO RELATED APPLICATIONS

This application claims the benefit of U.S. Provisional Application No. 62/744,951, filed on Oct. 12, 2018, entitled "Power Switch Control in a Memory Device", of which the entire disclosure is hereby incorporated by reference in its entirety.

BACKGROUND

Some known memory devices, such as a static random access memory (SRAM) device, include a power switch control design. A typical SRAM memory device has an array of memory cells. Each memory cell uses six transistors connected between an upper reference potential and a lower reference potential (typically ground) such that one of two storage nodes can be occupied by the information to be stored, with the complementary information stored at the other storage node. Some SRAM arrangements operate the memory logic in a low voltage domain, while the memory array is operated in the high voltage domain. Further, various techniques may be employed to reduce power consumption. For example, portions of the memory device may be turned off during a sleep, or shutdown mode. Problems can arise if switching procedures are not carefully controlled. For example, header switches can be stressed if the power supplies are allowed to short together for a period of time, particularly after numerous switching cycles. Additionally, direct current (DC) leakage between header switches can result in large shutdown leakage in the shutdown mode when only internal header switches are turned off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
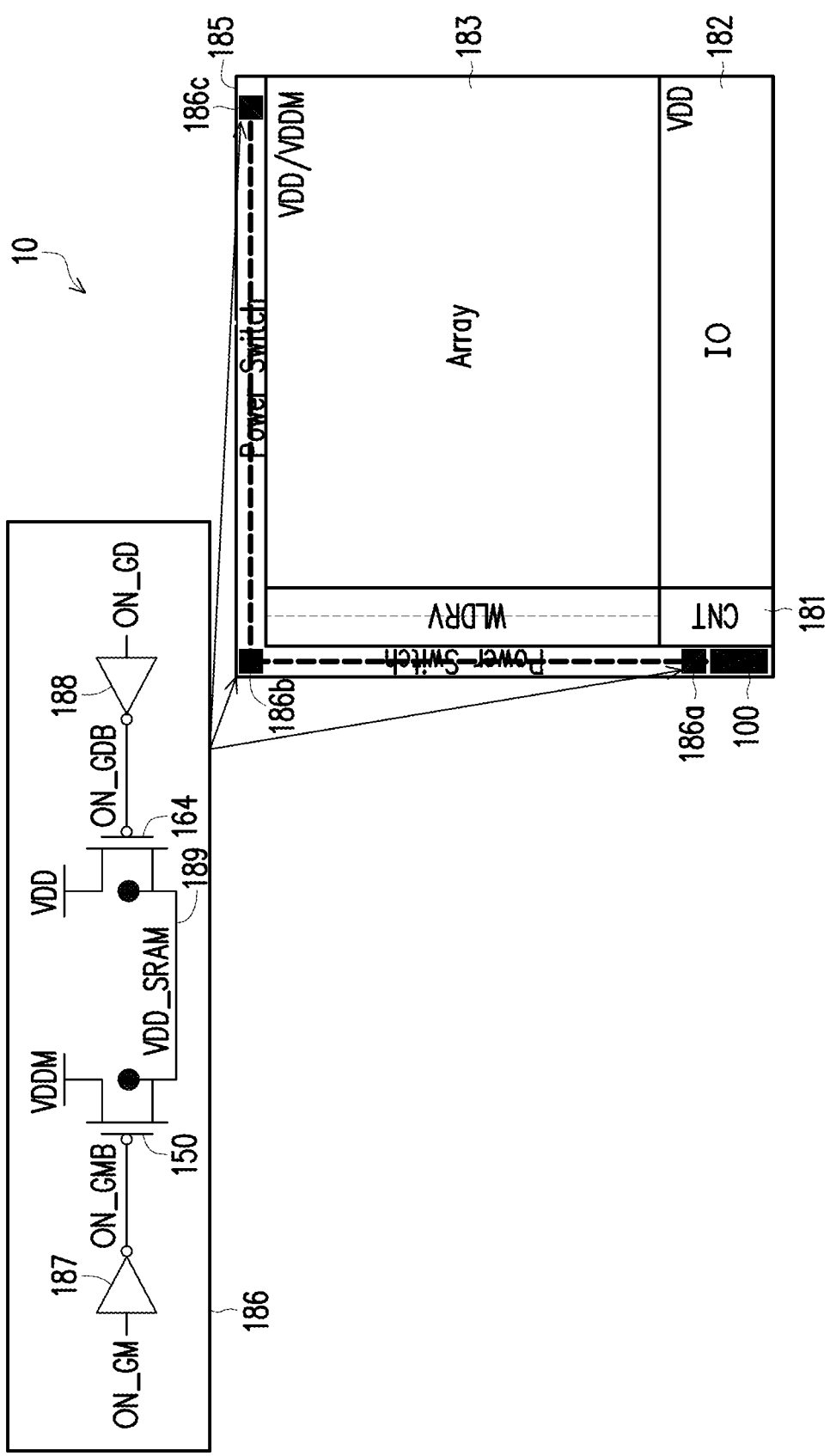
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic devices can have a portion powered selectively by two different external power supplies. A memory device, such as but not limited to a static random access memory (SRAM) device, is an example of such an electronic device.

FIG. 1 shows an example electronic device, such as an SRAM memory device 10 in accordance with some embodiments. As shown in FIG. 1, the example SRAM device 10 includes at least an input/output (IO) portion 182, a control circuit 181, a bitcell array 183, a word line (WL) driver 184 and a power switch 185. The SRAM device 10 may include other components not shown in FIG. 1. In example embodiments, the SRAM device 10 may be part of an integrated circuit (IC) chip.

The IO portion 182 and the control portion 181 both operate with an internal voltage supply VDD (i.e., in an internal power domain VDD). The bitcell array 183 operates selectively in first or second power domains, the first corresponding to a first power supply voltage VDD, the second corresponding to a second power supply voltage VDDM. The word line driver portion 184 provides driving signals and can be considered as operating in both the first and second power domains VDD and VDDM.

The power switch portion 185 is provided along the periphery of the bitcell array 183 for switching between VDD and VDDM. The power switch portion 185 includes a power switch control circuit 100. In some embodiments, the power switch control circuit 100 may be included in the control portion 181. The power switch portion 185 further includes a main power switch 186 that is distributed across the full memory macro. In some embodiments, the instances of the main power switch 186 are included along the entire periphery of the bitcell array 183 and include, for example, a first instance 186a, an intermediate instance 186b and a last instance 186c, as well as instances between 186a and 186b and instances between 186b and 186c.

Each instance of the main power switch 186 includes an internal supply rail 189. The internal supply rail 189 is connected to the VDD power supply through a PMOS header switch 164 and is connected to the VDDM power supply through a PMOS header switch 150. The VDD header switch 164 is responsive to a control signal ON_GDB, which is provided from an inverter 188 from a signal ON_GD. The signal ON_GD is used to select VDD. The VDDM header switch 150 is responsive to a control signal ON_GMB, which is provided from an inverter 187 from a signal ON_GM. The signal ON_GM is used to select VDDM. The signals ON_GD and ON_GM are switch control signals and are provided to each instances of the main power switch 186.

In some examples, when a circuit is powered up, many transistors are turned on at a same time. Powering up the circuit is also called waking up the circuit because the circuit is woken up for operation, from a shutdown or sleep mode, for example. When many transistors are turned on during waking up, a large amount of current flows through corresponding power nodes used by the transistors and may result in a current spike called a wakeup peak current. Reducing the wakeup peak current of a circuit to be within a design specification increases a wakeup time of the circuit. For example, in an approach, a wakeup circuit includes a series of wakeup stages. Each wakeup stage includes a PMOS switch connected in a chain manner. A wakeup signal is sequentially fed to each PMOS switch to turn on the chained PMOS switches one by one in a sequential manner. By turning on each PMOS switch in a sequential manner, the wakeup peak current is reduced. Noise resulting from switching operations during wakeup may affect switch control.

Figure 2:
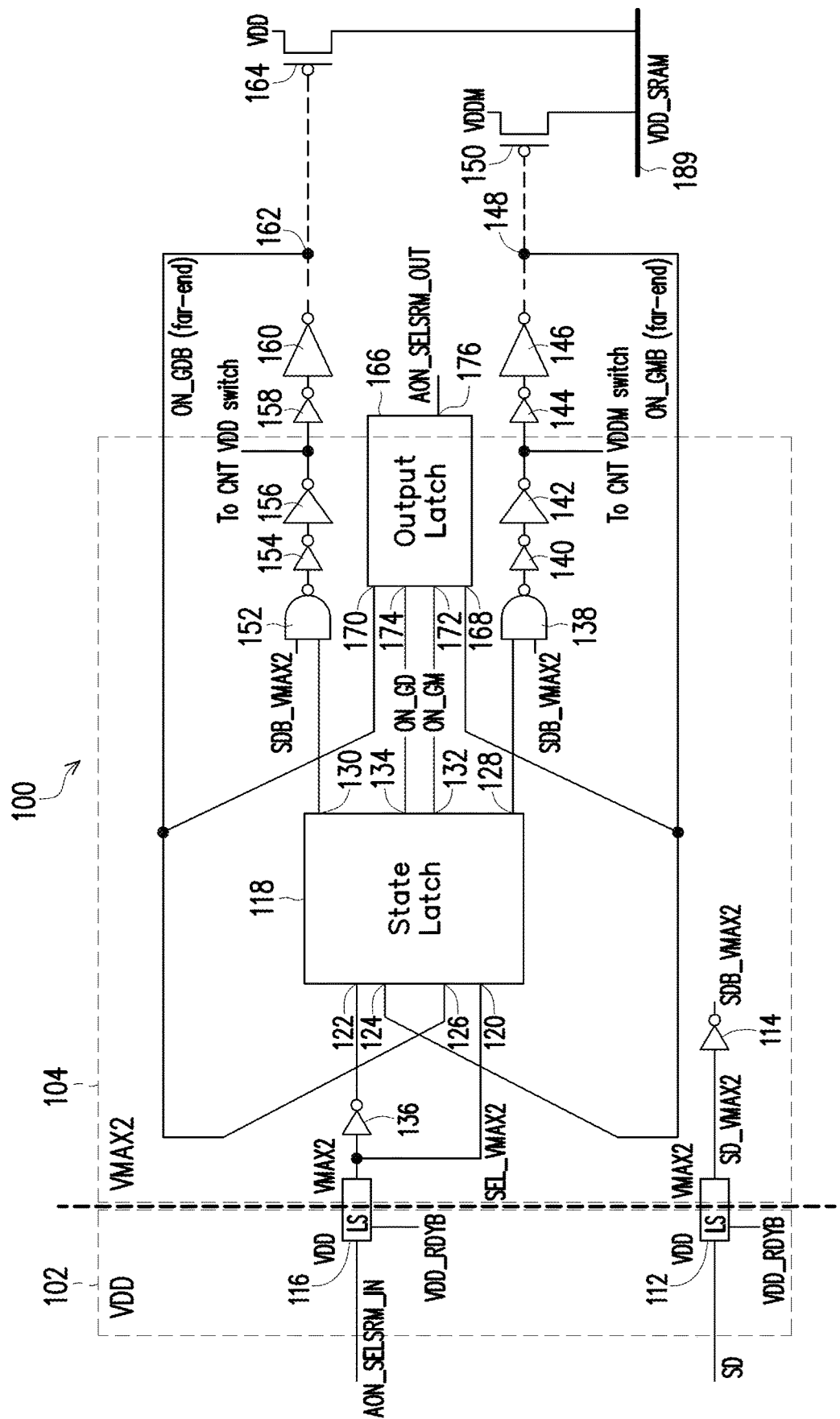
FIG. 2 is a circuit diagram illustrating an example of a power switch control circuit of the memory device of FIG. 1 in accordance with some embodiments.

FIG. 2 shows an example of a power switch control circuit 100 in accordance with aspects of the disclosure. As shown in FIG. 2, devices to the left of the dashed line are in a first power domain 102, whereas devices to the right of the dashed line are in a third power domain 104. In the illustrated example, the first power domain 102 is the VDD domain configured to receive a VDD power supply voltage, and the third power domain 104 is the VMAX2 power domain configured to receive a higher VMAX2 power supply voltage. In other words, the third power domain (i.e., the VMAX2 power supply voltage) 104 is for the power switch control circuit 100 to operate. The first power domain (i.e., the VDD power supply voltage) 102 and the second power domain (i.e., the VDDM power supply voltage) are for the bitcell array 183 to operate. In some embodiments, the VMAX2 power supply voltage may be higher than the VDDM power supply voltage. In some embodiments, the VMAX2 power supply voltage may be equal to the VDDM power supply voltage. In some embodiments, the VMAX2 power supply voltage may be lower than the VDDM power supply voltage. The power switch control circuit 100 is configured to control the VDD header switch 164 and VDDM header switch 150 in response to a turn on signal AON_SELSRM_IN, a ready signal VDD_RDYB, and a shutdown signal SD. The AON_SELSRM_IN signal is asserted to select either the VDD or VDDM power domain, and the SD signal indicates the shutdown mode.

In general, the power switch control circuit 100 is configured to turn both the VDD header switch 164 and VDDM header switch 150 off when the device 10 is in the shutdown mode (i.e., SD=1). Further, the circuit 100 is configured to latch both the VDD header switch 164 and VDDM header switch 150 off even in the event factors such as noise affect control signals of the circuit. For instance, as noted above in conjunction with FIG. 1, the power switch 186 may be distributed across the full memory macro, resulting in relatively long control signal lines for controlling the various power switches, such signal feedback lines. These long signal lines could result in signal loss and thus oscillations in some of the control signals. As will be discussed in further detail below, some disclosed embodiments may address issues such as these by making the power switch control circuit 100 more robust and less vulnerable to various signal fluctuations.

In general, the power switch control circuit 100 includes two latches, among other things. A first, or state latch 118 facilitates a "make-before-break" function during a functional mode (i.e. non-shutdown state) and also prevents both the VDD and VDDM header switches 164, 150 from simultaneously turning on when the SD signal transitions during wakeup. In the internal VDD domain 102, the first shutdown signal SD is level shifted from the internal VDD domain 102 to a higher voltage level, such as the VMAX2 domain 104 by a level shifter 112, generating a second shutdown signal SD_VMAX2. The signal SD_VMAX2 is provided to an inverter 114, generating a second shutdown signal bar SDB_VMAX2. On the other hand, in the internal VDD domain 102, the turn on signal AON_SELSRM_IN is level shifted from the internal VDD domain 102 to a SEL_VMAX2 signal in the VMAX2 domain 104 by a level shifter 116.

The output of the level shifter 116 (i.e., the signal SEL_VMAX2) is provided to a set input 120 of the state latch 118. The output of the level shifter 116 is also provided to an inverter 136, and the output of the inverter 136 is provided to a reset input 122 of the state latch 118. The state latch outputs global VDD and VDDM selection signals ON_GD and ON_GM, respectively. The ON_GM signal is provided from a first output 128 of the state latch 118 along with the signal SDB_VMAX2 to a NAND gate 138. The output of the NAND gate 138 is provided to a plurality of inverters including inverters 140, 142, 144, 146 generating a delayed signal of the output of the NAND gate 138 to the VDDM header switch(s) 150. At a node 148, a feedback signal ON_GMB is provided back to a first feedback input 124 of the state latch 118. The signal On_GMB at the node 148 is also provided to a gate of the VDDM header switch 150. In other words, a delayed signal of the output of the NAND gate 138 is provided to the gate of the VDDM header switch 150. In this example, the VDDM header switch 150 is a PMOS transistor. A source of the VDDM header switch 150 is connected to the power supply VDDM, whereas a drain of the VDDM header switch 150 is connected to the internal supply rail 189. As noted above, in some embodiments the power switch 186 is distributed across the full memory macro. Accordingly, a plurality of the VDDM header switches 150 may be distributed across the memory macro, and the ON_GM control signal as delayed by the inverters may be sequentially provided to the VDDM header switches 150 for sequential control thereof.

During the shutdown period, the signal SD and thus the signal SD_VMAX2 are logical high (1) whereas the signal SDB_VMAX2 is logical low (0). Therefore, during the shutdown period, the output of the NAND gate 138 is logical high (1), regardless of the value of the outputs of the state latch 118. Thus, the signal provided to the gate of the VDDM header switch 150 is logical high (1). Accordingly, during the shutdown period, the VDDM header switch 150 is always turned off.

On the other hand, the ON_GD signal is provided from a second output 130 of the state latch 118 along with the signal SDB_VMAX2 to a NAND gate 152. The output of the NAND gate 152 is provided to a plurality of inverters including inverters 154, 156, 158, 160, generating delayed signals of the output of the NAND gate 152, which are used to control the VDD switches (e.g., the VDD header switch 164). As noted above, in some embodiments the power switch 186 is distributed across the full memory macro. Accordingly, a plurality of the VDD header switches 164 may be distributed across the memory macro, and the ON_GD control signal as delayed by the inverters may be sequentially provided to the VDD header switches 164 for sequential control thereof.

At a node 162, a signal ON_GDB is fed back to a second feedback input 126 of the state latch 118. The signal ON_GDB at the node 162 is also provided to a gate of the VDD header switch 164. In other words, a delayed signal of the output of the NAND gate 152 is provided to the gate of the VDD header switch(s) 164. In this example, the VDD header switch 164 is a PMOS transistor. A source of the VDD header switch 164 is connected to a power supply VDD, whereas a drain of the VDD header switch 164 is connected to the internal supply rail 189. The internal supply rail 189 is used to supply power to the bitcell array 183.

During the shutdown period, the signal SD_VMAX2 is logical high (1) whereas the signal SDB_VMAX2 is logical low (0) as noted above. Therefore, during the shutdown period, the output of the NAND gate 152 is logical high (1), regardless of the value of the second output 130 of the state latch 118. Thus, the signal provided to the gate of the VDD header switch 164 is logical high (1). Accordingly, during the shutdown period, the VDD header switch 164 is always turned off. As a result, during the shutdown period, the power switch control circuit 100 is configured such that both the VDDM header switch 150 and the VDD header switch 164 are turned off in response to the SD signal, regardless of the select signal AON_SELSRM_IN. By shutting down both the header switches 150 and 164, DC leakage between the header switches 150 and 164 can be reduced. By shutting down both the header switches 150 and 164 as well as other header switches, the overall shutdown leakage is reduced. Further, the signals at the nodes 162 and 148 are fed back to the feedback inputs 126 and 124 to latch the inputs to the header switches 164, 150, and insure these header switches remain off during the shutdown mode.

An output latch 166 has four inputs: a first input 168; a second input 170; a third input 172; and a fourth input 174. The signal ON_GMB is fed back from the node 148 to the first input 168 of the output latch 166. The signal ON_GDB is fed back from the node 162 to the second input 170 of the output latch 166. A third output 132 of the state latch 118 provides the ON_GD signal to the third input 172 of the output latch 166. A fourth output 134 of the state latch 118 provides the ON_GM signal to the fourth input 174 of the output latch 166. A signal AON_SELSRM_OUT is generated by the output latch 166 at the output 176 of the output latch 166. It should be noted that the signal AON_SELSRM_OUT is in the internal VDD domain 102. As will be discussed in further detail below, the output latch 166 is configured such that during shutdown the states of the ON_GDB and ON_GMB signals are latched so as to hold the header switches 164, 150 off, while in a functional mode the ON_GDB and ON_GMB control the output latch state.

Figure 3:
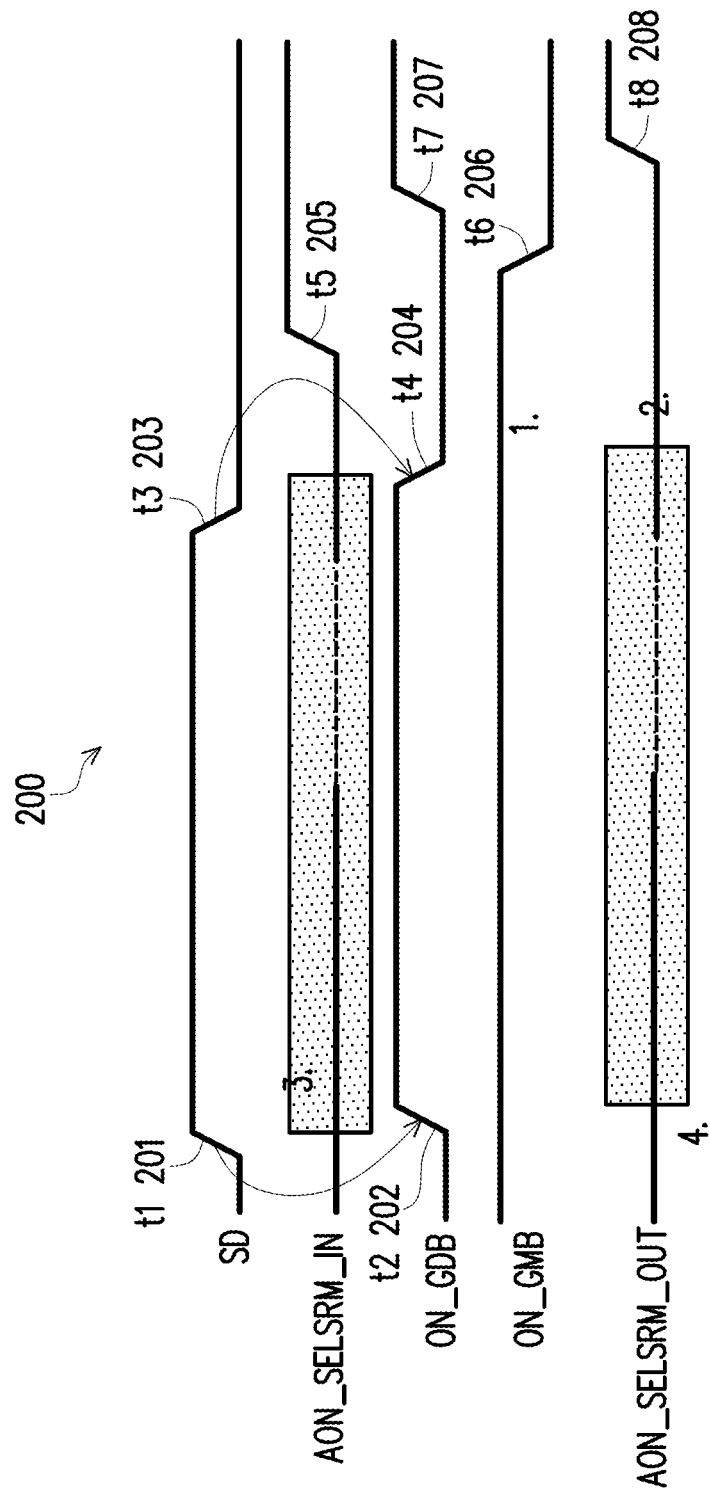
FIG. 3 is a timing diagram illustrating wave forms of the circuit of FIG. 4 in accordance with some embodiments.

FIG. 3 illustrates a timing diagram in accordance with some examples. The timing diagram 200 will be disclosed below with reference to FIGS. 4 and 5. As can be seen from the timing diagram of FIG. 3, the signal SD is initially logical low (0). At time t1 201, the signal SD becomes logical high (1), which means that the power switch control circuit 100 is in the shutdown period. At time t3 203, the signal SD becomes logical low (0), which means that the shutdown period of the power switch control circuit 100 ends. In one embodiment, the signal AON_SELSRM_IN is not allowed to toggle during the shutdown period (i.e., from time t1 201 to time t3 203) or a shutdown wakeup period (i.e., a short period after time t3 203). In the example of FIG. 3, the signal AON_SELSRAM_IN is constantly logical low (0) until time t5 205, which is after the shutdown period has ended. The signal AON_SELSRAM_IN becomes logical high (1) at time t5 205. When the signal AON_SELSRAM_IN is logical low (0) (e.g., before time t5 205), the signal ON_GDB is supposed to be logical low (0) (e.g., before time t2 202) whereas the signal ON_GMB is supposed to be logical high (1) (e.g., before time t6 206), which indicates a selection of VDD and deselection of VDDM because the VDDM header switch 150 is turned off whereas the VDD header switch 164 is turned on. When the signal AON_SELSRAM_IN is logical high (1) (e.g., after time t5 205), the signal ON_GDB is supposed to be logical high (1) (e.g., after time t7 207) whereas the signal ON_GMB is supposed to be logical low (0) (e.g., after time t6 206), which indicates a selection of VDDM and deselection of VDD because the VDD header switch 164 is turned off whereas the VDDM header switch 150 is turned on.

As described above, during the shutdown period (i.e., from time t2 202 to time t4 204), both the VDDM header switch 150 and the VDD header switch 164 are turned off due to the signal SD. The signal AON_SELSRM_OUT does not respond to the toggling of the signal SD. Instead, the signal AON_SELSRM_OUT responds to, at time t8 208 with delay, the change of the signal AON_SELSRM_IN at time t5 205. Additionally, when the signal ON-GDB becomes logical low (0) at time t4 204, the signal ON_GMB keeps logical high (1) before time t6 206. Therefore, the falling of the signal SD at time t3 203 does not trigger a power short between the two domains (i.e., VDD and VDDM). The timing diagram 200 will be disclosed further below with reference to FIGS. 4 and 5.

Figure 4:
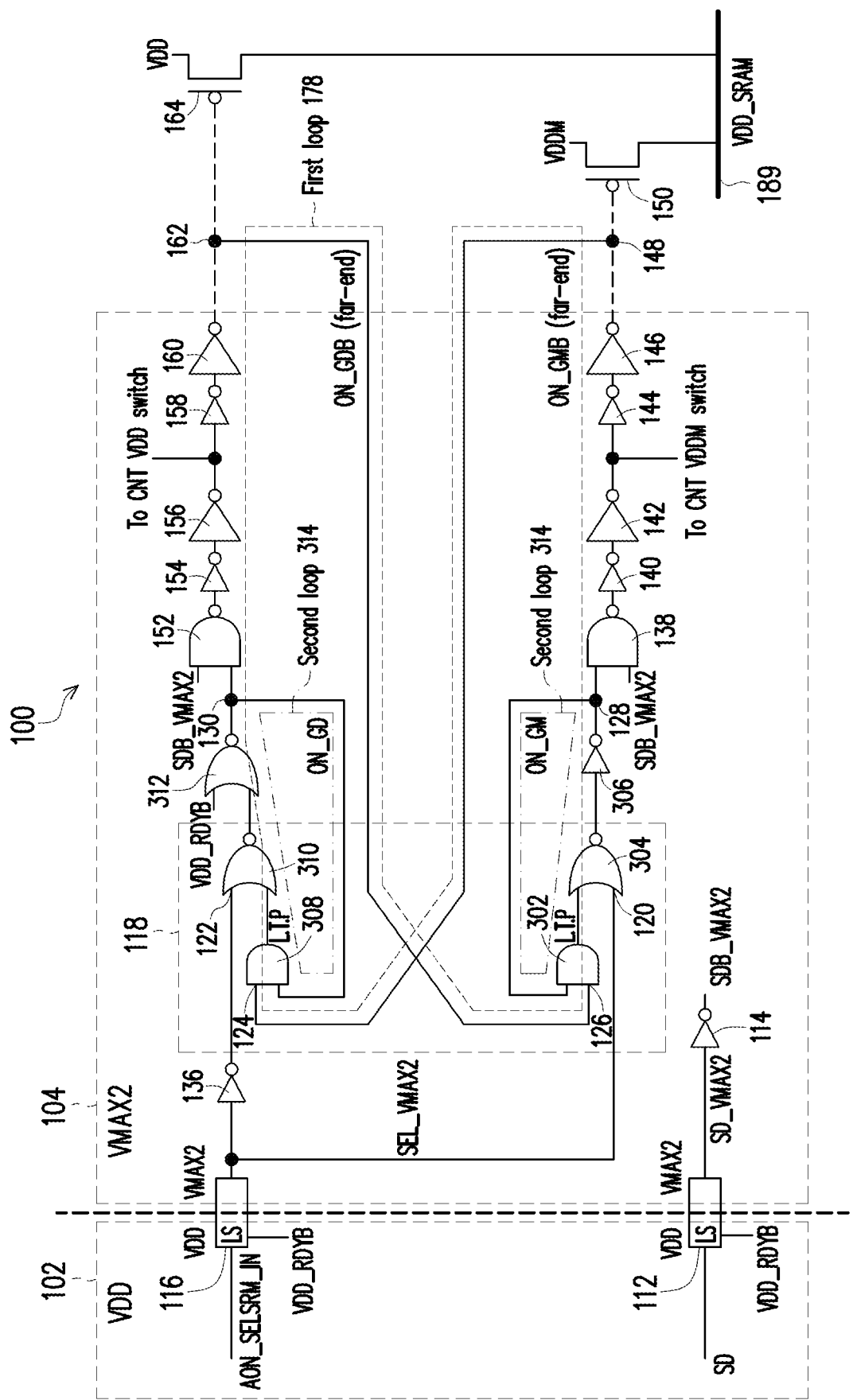
FIG. 4 is a circuit diagram illustrating a first latch circuit of the power switch control circuit of FIG. 2 in accordance with some embodiments.

FIG. 4 shows an embodiment of the state latch 118 of the power switch control circuit 100 of FIG. 2. In this embodiment, the state latch 118 of the power switch control circuit 100 includes an AND gate 302, a NOR gate 304, an inverter 306, an AND gate 308, a NOR gate 310 and a NOR gate 312.

The cross-coupled NOR gate 304 and the NOR gate 310 function as an SR latch. Specifically, the output (i.e., the signal SEL_VMAX2) of the level shifter 116 is provided to the NOR gate 304 at the set input 120 of the state latch 118. An output of the AND gate 302 is also provided to the NOR gate 304. An output of the NOR gate 304 is provided to the inverter 306. The output of the inverter 306 at the first output 128 of the state latch 118 is the signal ON_GM. The signal ON_GM is further provided back to an input of the AND gate 302. The signal ON_GDB at the node 162 is provided to the other input (i.e., the second feedback input 126 of the state latch 118) of the AND gate 302.

On the other hand, the output of the inverter 136 is provided to the NOR gate 310 at the reset input 122 of the state latch 118. An output of the AND gate 308 is also provided to the NOR gate 310. An output of the NOR gate 310 is provided along with a signal VDD_RDYB to the NOR gate 312. The output of the NOR gate 312 at the second output 130 of the state latch 118 is the signal ON_GD. The signal ON_GD is further provided back to an input of the AND gate 308. The signal ON_GMB at the node 148 is provided to the other input (i.e., the first feedback input 124 of the state latch 118) of the AND gate 308.

A first feedback loop 178 is formed by feeding back the ON_GDB signal from the node 162 to the AND gate 302 and the ON_GMB signal from the node 148 to the AND gate 308. Thus, in the first loop 178, the control signal ON_GDB for the VDD header 164 generated by the upper leg of the state loop 118 is fed back to the lower leg of the state loop 118, which generates the control signal ON_GMB for the VDDM header 150. Further, in the first loop 178, the control signal ON_GMB for the VDDM header 150 generated by the lower leg of the state loop 118 is fed back to the upper leg of the state loop 118, which generates the control signal ON_GDB for the VDD header 164.

Accordingly, when the power switch control circuit 100 is in a functional mode (i.e. SD=0), the first loop 178 performs the make-before-break function referenced above, in which the power headers 164, 150 are not simultaneously off during the functional mode. The AND gates 302, 308 that generate respective inputs to the cross-coupled NOR gates 304, 310 prevent the latch from outputting simultaneously logical high outputs for the ON-GMB and ON_GDB control signals.

During the shutdown period, as described above, the signal ON_GMB is constantly logical high (1) whereas the signal ON_GDB is also constantly logical high (1), as shown in FIG. 3. Accordingly, one input (i.e., the second feedback input 126 of the state latch 118) of the AND gate 302 is constantly logical high (1), thus the output of the AND gate 302 is the same as the other input of the AND gate 302 (i.e., the signal ON_GM). The signal ON_GM is provided back, along with the output (i.e., the signal SEL_VMAX2) of the level shifter 116, to NOR gate 304. Likewise, one input (i.e., the first feedback input 124 of the state latch 118) of the AND gate 308 is constantly logical high (1), thus the output of the AND gate 308 is the same as the other input of the AND gate 308 (i.e., the signal ON_GD). The signal ON_GD is provided back, along with the output of the inverter 124, to the NOR gate 310. In other words, during the shutdown period, the second loop 314 breaks the first loop 178, thereby preventing power noise from the signal ON_GDB and the signal ON_GMB after the shutdown wakeup (i.e., SD transitioning from logic high to low).

Figure 5:
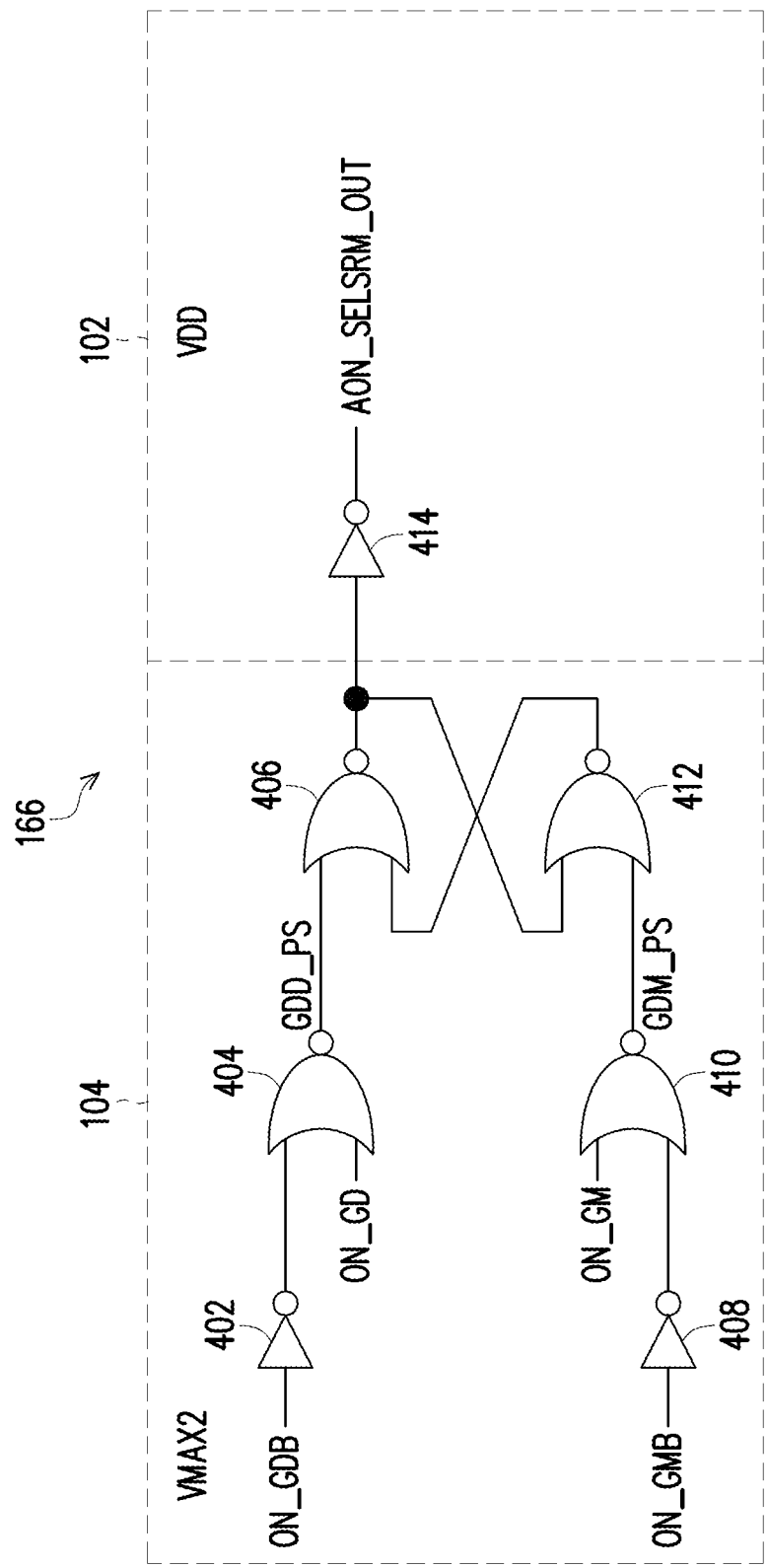
FIG. 5 is a circuit diagram illustrating a second latch circuit of the power switch control circuit of FIG. 2 in accordance with some embodiments.

FIG. 5 shows an embodiment of the output latch 166 of the power switch control circuit 100 of FIG. 2. In this embodiment, the output latch 166 of the power switch control circuit 100 includes an inverter 402, a NOR gate 404, a NOR gate 406, an inverter 408, a NOR gate 410, a NOR gate 412 and an inverter 414. Specifically, the signal ON_GDB is provided to the inverter 402. The output of the inverter 402 which is a signal ON_GD is provided, along with the signal ON_GD, to the NOR gate 404. The output of the NOR gate 404 (i.e., a signal GDD_PS) is provided to a reset input of a flip-flop consisting of the NOR gate 406 and the NOR gate 412. On the other hand, the signal ON_GMB is provided to the inverter 408. The output of the inverter 408 which is a signal ON_GM is provided, along with the signal ON-GM, to the NOR gate 410. The output of the NOR gate 410 (i.e., a signal GDM_PS) is provided to a set input of the flip-flop consisting of the NOR gate 406 and the NOR gate 412. The output of the flip-flop consisting of the NOR gate 406 and the NOR gate 412 is provided to the inverter 414. The output of the inverter 414 is the signal SON_SELSRM_OUT in the internal VDD domain 102.

During a function mode, the signal ON_GDB and the signal ON_GMB control the state of the output latch 166. In other words, the output latch 166 latches the select signal AON_SELSRM_IN as the AON_SELSRM_OUT signal in response to the ON_GDB and ON_GMB signals. During the shutdown period, as described above, the signal ON_GDB and the signal ON_GMB are both logical high (1). Thus, the output of the inverter 402 and the output of the inverter 408 are both logical low (0). The output of the NOR gate 404 is the signal ON_GDB whereas the output of the NOR gate 410 is the signal ON_GMB. Therefore, the output latch 166 keeps its state during the shutdown period. In other words, the state of the AON_SELSRM_OUT signal does not change during the shutdown period, even if the AON_SELSRM_IN signal changes during the shutdown period.

Another example power switch control circuit 100 of FIG. 2 is described below in connection with the timing diagram 500 of FIG. 6 and the circuit diagram of FIG. 7. As can be seen from the timing diagram of FIG. 6, the signal SD is initially logical low (0). At time t1 501, the signal SD becomes logical high (1), which means that the power switch control circuit 100 is in the shutdown period. At time t3 503, the signal SD becomes logical low (0), which means that the shutdown period of the power switch control circuit 100 ends. In one embodiment, the signal AON_SELSRM_IN is allowed to toggle during the shutdown period (i.e., from time t1 501 to time t3 503) or a shutdown wakeup period (i.e., a short period after time t3 503). For example, the signal AON_SELSRM_IN toggles from logical low (0) to logical high (1) at time t11 511, from logical high (1) to logical low (0) at time t12 512, from logical low (0) to logical high (1) at time t13 513, and from logical high (1) to logical low (0) at time t14 514. It should be noted that the signal the signal AON_SELSRM_IN may toggle in other patterns during the shutdown period or a shutdown wakeup period. The signal AON_SELSRAM_IN becomes logical high (1) at time t5 505. The final state (logical low) of the signal AON_SELRAM_IN before shutdown wakeup is the same as that (logical low) before the shutdown period begins at time t1 501. When the signal AON_SELSRAM_IN is logical low (0) (e.g., before time t11 511), the signal ON_GDB is supposed to be logical low (0) (e.g., before time t2 502) whereas the signal ON_GMB is supposed to be logical high (1) (e.g., before time t6 506), which indicates a selection of VDD and deselection of VDDM because the VDDM header switch 150 is turned off whereas the VDD header switch 164 is turned on. When the signal AON_SELSRAM_IN is logical high (1) (e.g., after time t5 505), the signal ON_GDB is supposed to be logical high (1) (e.g., after time t7 507) whereas the signal ON_GMB is supposed to be logical low (0) (e.g., after time t6 506), which indicates a selection of VDDM and deselection of VDD because the VDD header switch 164 is turned off whereas the VDDM header switch 150 is turned on.

As described above, during the shutdown period (i.e., from time t2 502 to time t4 504), both the VDDM header switch 150 and the VDD header switch 164 are turned off due to the signal SD. The signal AON_SELSRM_OUT does not respond to the toggling of the signal SD. Instead, the signal AON_SELSRM_OUT responds to, at time t8 508 with delay, the change of the signal AON_SELSRM_IN at time t5 505. Additionally, when the signal ON-GDB becomes logical low (0) at time t4 504, the signal ON_GMB keeps logical high (1) before time t6 506. Therefore, the falling of the signal SD at time t3 503 does not trigger power short between two domains (i.e., VDD and VDDM). The implementation of the timing diagram 500 will be disclosed below with reference to FIG. 7.

Figure 6:
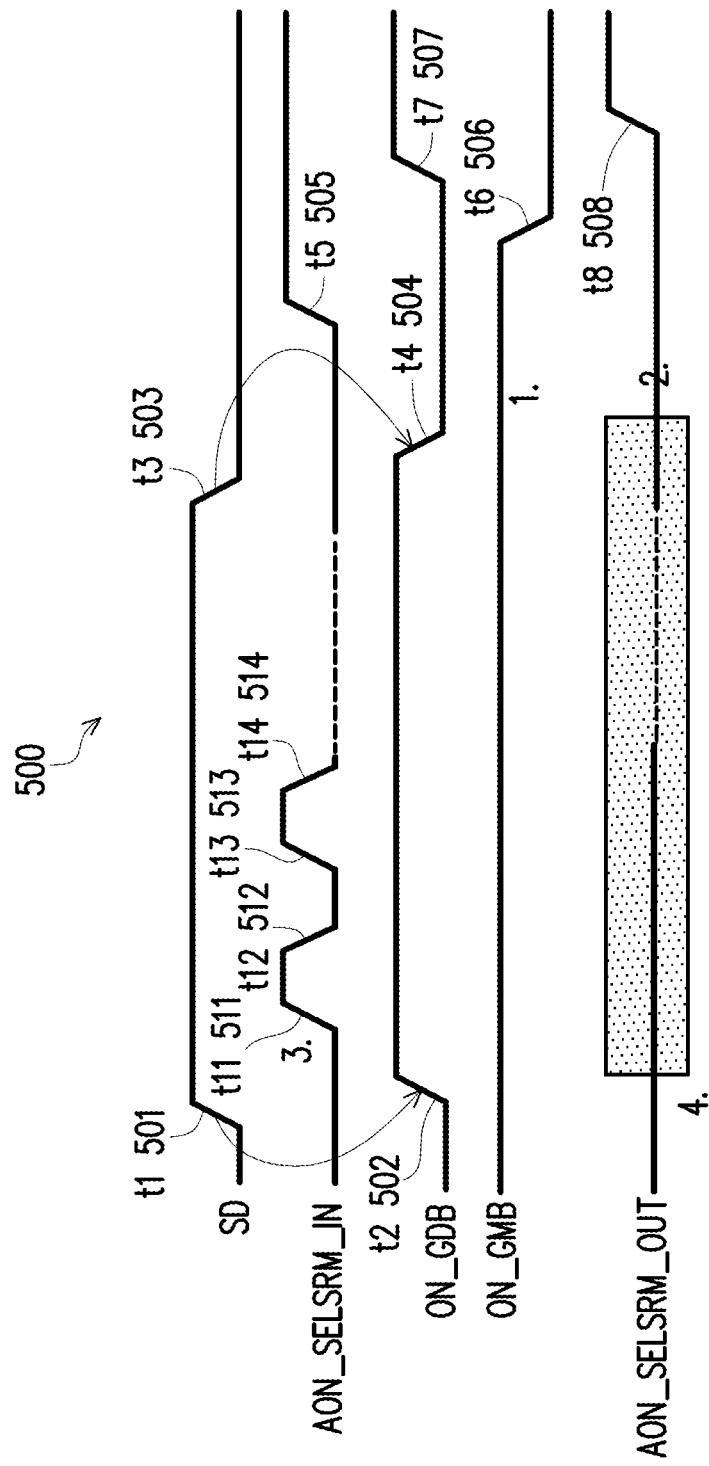
FIG. 6 is a timing diagram illustrating wave forms of the circuit of FIG. 7 in accordance with some embodiments.
Figure 7:
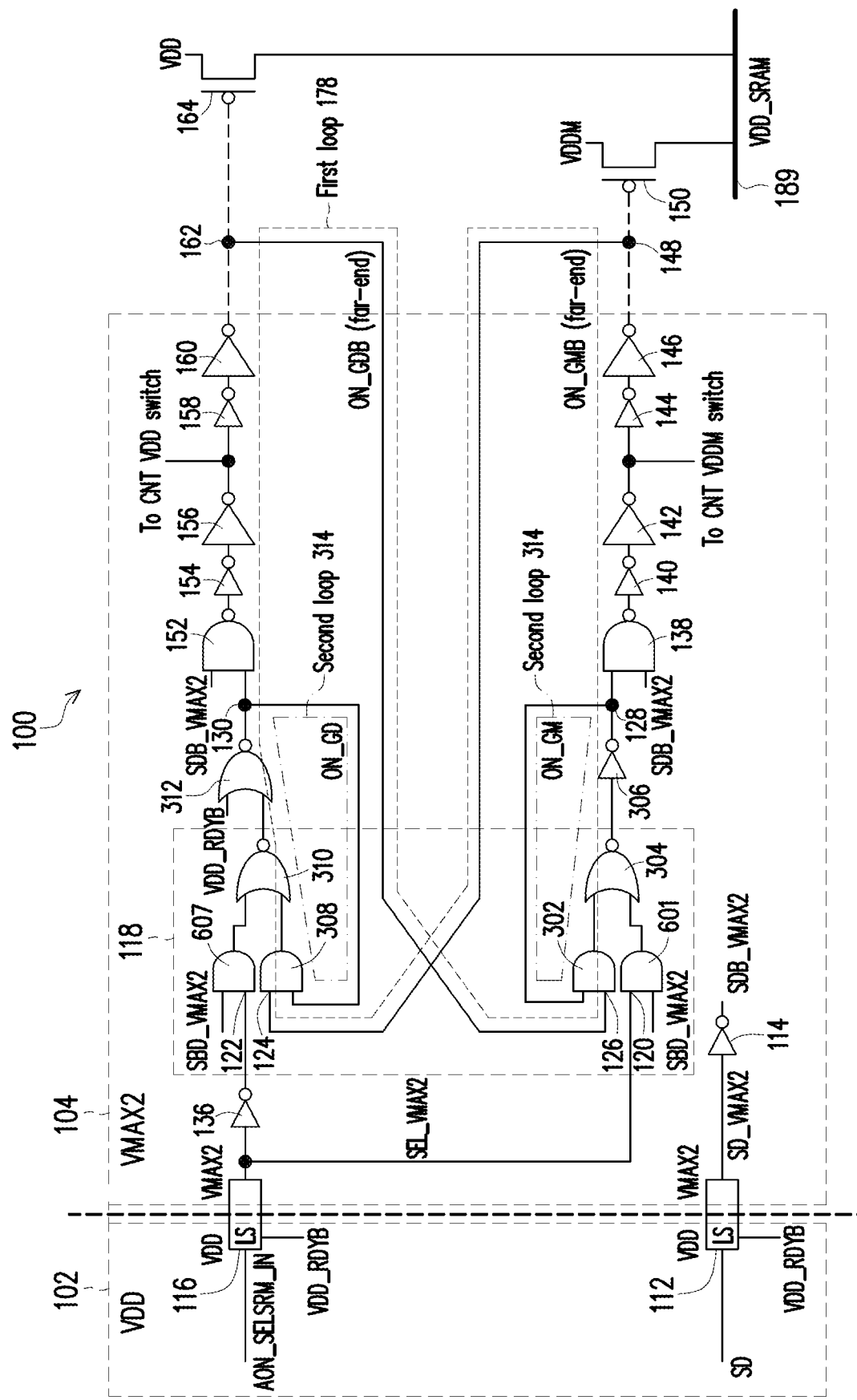
FIG. 7 is a circuit diagram illustrating another example of the first latch circuit of the power switch control circuit of FIG. 2 in accordance with some embodiments.

FIG. 7 shows an embodiment of the state latch 118 of the power switch control circuit 100 of FIG. 2 associated with the timing diagram 500 of FIG. 6. The state latch 118 of FIG. 7 includes the AND gate 302, a NOR gate 304, an inverter 306, an AND gate 308, a NOR gate 310 and a NOR gate 312 similar to the embodiment illustrated in FIG. 4. In FIG. 7, an AND gate 601, and an AND gate 607 are further included.

The cross-coupled NOR gate 304 and the NOR gate 310 function as a flip-flop of the state latch 118. Specifically, the output (i.e., the signal SEL_VMAX2) of the level shifter 116 is provided, along with the signal SDB_VMAX2, to the AND gate 601. The output of the AND gate 601 is provided to the NOR gate 304 at the set input 120 of the state latch 118. An output of the AND gate 302 is also provided to the NOR gate 304. An output of the NOR gate 304 is provided to the inverter 306. The output of the inverter 306 at the first output 128 of the state latch 118 is the signal ON_GM. The signal ON_GM is further provided back to an input of the AND gate 302. The signal ON_GDB at the node 162 is provided to the other input (i.e., the second feedback input 126 of the state latch 118) of the AND gate 302.

On the other hand, the output of the inverter 136 is provided, along with the signal SDB_VMAX2, to the NOR gate 310 at the reset input 122 of the state latch 118. An output of the AND gate 308 is also provided to the NOR gate 310. An output of the NOR gate 310 is provided along with a signal VDD_RDYB to the NOR gate 312. The output of the NOR gate 312 at the second output 130 of the state latch 118 is the signal ON_GD. The signal On_GD is further provided back to an input of the AND gate 308. The signal ON_GMB at the node 148 is provided to the other input (i.e., the first feedback input 124 of the state latch 118) of the AND gate 308.

During a function mode, a first loop 178 may carry out the make-before-break function. During the shutdown period, as described above, the signal SDB_VMAX2 is constantly logical low (0), whereas the signal ON_GMB and the signal ON_GDB are both constantly logical high (1), as shown in FIG. 6. Accordingly, one input (i.e., the second feedback input 126 of the state latch 118) of the AND gate 302 is constantly logical high (1), thus the output of the AND gate 302 is the same as the other input of the AND gate 302 (i.e., the signal ON_GM). The signal ON_GM is provided back, along with the output of the AND gate 601, to the NOR gate 304. Likewise, one input (i.e., the first feedback input 124 of the state latch 118) of the AND gate 308 is constantly logical high (1), thus the output of the AND gate 308 is the same as the other input of the AND gate 308 (i.e., the signal ON_GD). The signal ON_GD is provided back, along with the output of the AND gate 607, to the NOR gate 310. In other words, during the shutdown period, the second loop 314 breaks the first loop 178, thereby preventing power noise from the signal ON_GDB and the signal ON_GMB after the shutdown wakeup.

Because the signal SDB_VMAX2 is constantly logical low (0) during the shutdown period, the output of the AND gate 601 and the output of the AND gate 607 are constantly logical low (0). Therefore, the flip-flop of the state latch 118 including the cross-coupled NOR gate 304 and the NOR gate 310 is in a hold state. Thus, the signal AON_SELSRM_IN is allowed to toggle (i.e., the toggling of the signal AON_SELSRM_IN is gated) during the shutdown period (i.e., from time t1 501 to time t3 503) or a shutdown wakeup period (i.e., a short period after time t3 503), as shown in FIG. 6.

Figure 8:
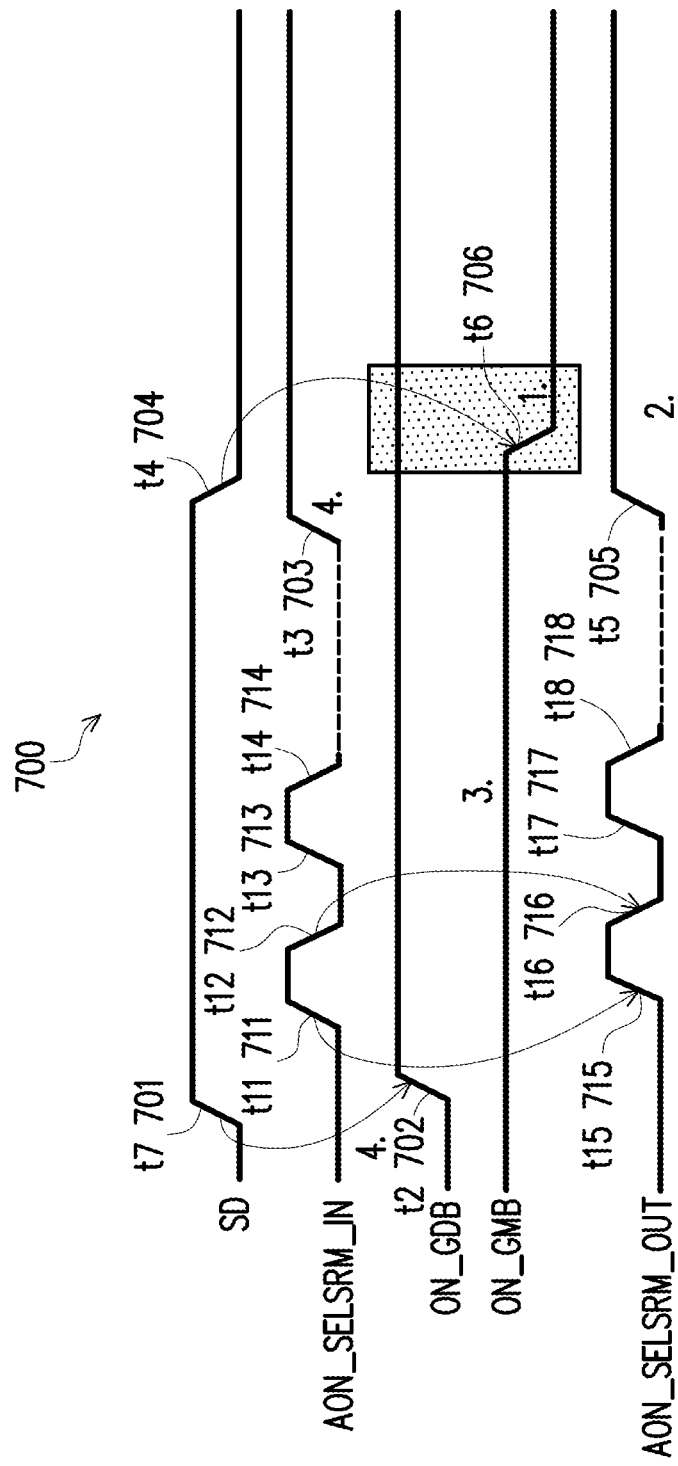
FIG. 8 is a timing diagram illustrating wave forms of the circuit of FIG. 9 in accordance with some embodiments.

Another example operation of the example power switch control circuit 100 is disclosed below with reference to FIGS. 8 and 9. As can be seen from the timing diagram of FIG. 8, the signal SD is initially logical low (0). At time t1 701, the signal SD becomes logical high (1), which means that the power switch control circuit 100 is in the shutdown period. At time t4 704, the signal SD becomes logical low (0), which means that the shutdown period of the power switch control circuit 100 ends. In one embodiment, the signal AON_SELSRM_IN is allowed to toggle during the shutdown period (i.e., from time t1 701 to time t4 704) or a shutdown wakeup period (i.e., a short period after time t4 704). For example, the signal AON_SELSRM_IN toggles from logical low (0) to logical high (1) at time t11 711, from logical high (1) to logical low (0) at time t12 712, from logical low (0) to logical high (1) at time t13 713, and from logical high (1) to logical low (0) at time t14 714. It should be noted that the signal the signal AON_SELSRM_IN may toggle in other patterns during the shutdown period or a shutdown wakeup period. The signal AON_SELSRAM_IN becomes logical high (1) at time t3 703. Unlike the timing diagram 200 of FIG. 3 and 500 of FIG. 6, the final state (logical high) of the signal AON_SELRAM_IN before shutdown wakeup at time t4 704 is different from that (logical low) before the shutdown period begins at time t1 701. Because the signal AON_SELSRM_IN toggles from logical low (0) to logical (1) at time t3 703 before the signal SD toggles from logical high (1) to logical low (0) at time t4 704, the signal ON_GMB toggles from logical high (1) to logical low (0) at time t6 706, following the fall of the signal SD at time t4 704.

When the signal AON_SELSRAM_IN is logical low (0) (e.g., before time t11 711), the signal ON_GDB is supposed to be logical low (0) (e.g., before time t2 702) whereas the signal ON_GMB is supposed to be logical high (1) (e.g., before time t6 506), which indicates a selection of VDD and deselection of VDDM because the VDDM header switch 150 is turned off whereas the VDD header switch 164 is turned on. When the signal AON_SELSRAM_IN is logical high (1) (e.g., after time t3 703), the signal ON_GDB is supposed to be logical high (1) (e.g., after time t3 703) whereas the signal ON_GMB is supposed to be logical low (0) (e.g., after time t6 706), which indicates a selection of VDDM and deselection of VDD because the VDD header switch 164 is turned off whereas the VDDM header switch 150 is turned on.

As described above, during the shutdown period (i.e., from time t2 702 to time t6 706), both the VDDM header switch 150 and the VDD header switch 164 are turned off due to the signal SD. The signal AON_SELSRM_OUT does not respond to the toggling of the signal SD. Instead, the signal AON_SELSRM_OUT responds, with delay, to the change of the signal AON_SELSRM_IN. Additionally, when the signal ON_GMB becomes logical low (0) at time t6 706, the signal ON_GDB keeps logical high (1). Therefore, the falling of the signal SD at time t4 703 does not trigger power short between two domains (i.e., VDD and VDDM). The implementation of the timing diagram 700 will be disclosed below with reference to FIG. 9.

Figure 9:
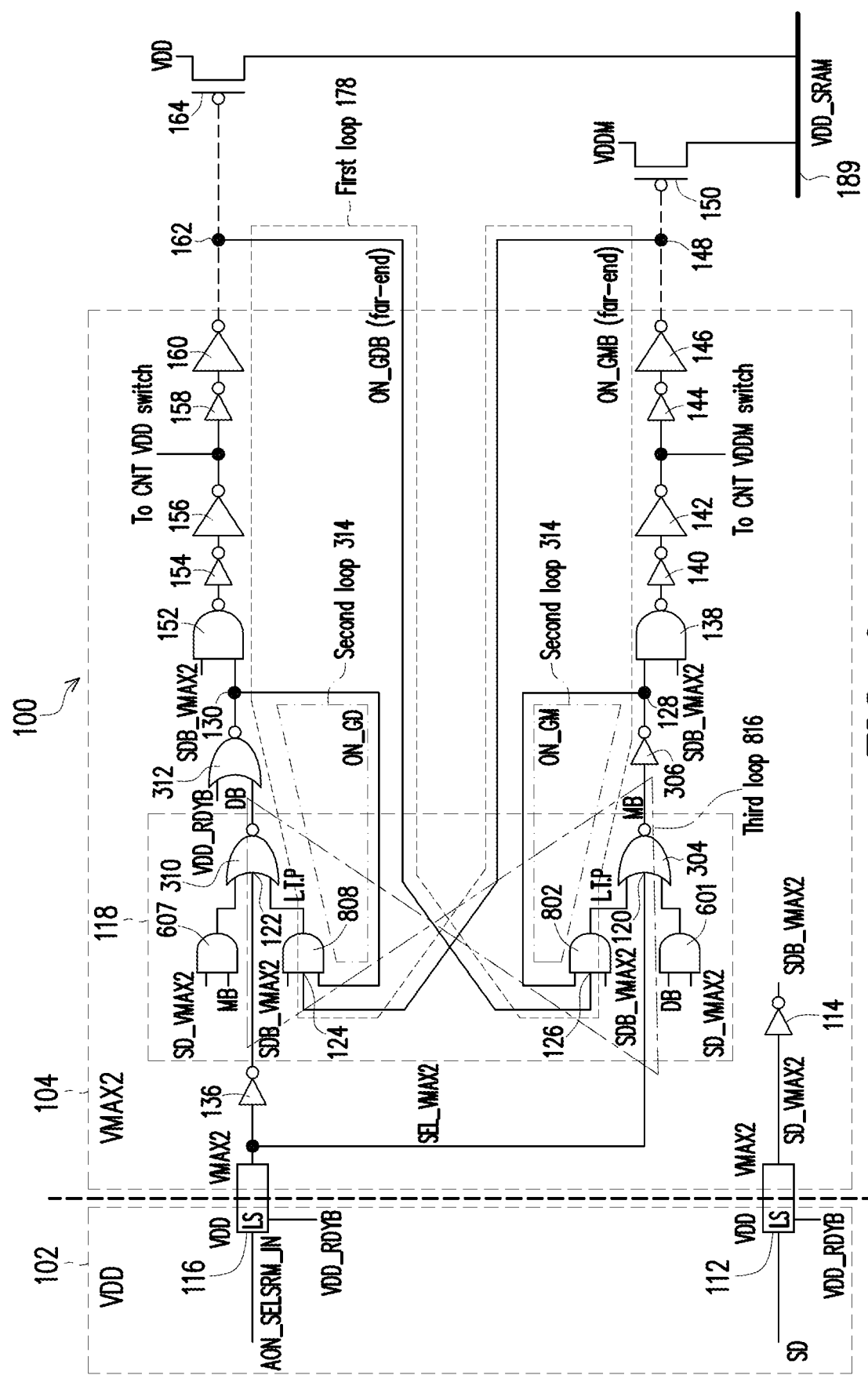
FIG. 9 is a circuit diagram illustrating another example of the first latch circuit of the power switch control circuit of FIG. 2 in accordance with some embodiments.

FIG. 9 shows an embodiment of the state latch 118 of the power switch control circuit 100 of FIG. 2 associated with the timing diagram 700 of FIG. 7. Same reference numerals are used for same parts as in FIG. 1. In this embodiment, the state latch 118 of the power switch control circuit 100 includes the AND gate 601, the AND gate 802, the NOR gate 304, the inverter 306, the AND gate 607, the AND gate 808, the NOR gate 310 and the NOR gate 312. As will be discussed further below, the AND gates 802, 808 are similar to the AND gates 302, 308 discussed above in conjunction with FIGS. 4 and 7, though the AND gates 802, 808 each have three inputs.

The cross-coupled NOR gate 304 and the NOR gate 310 function as a flip-flop of the state latch 118. Specifically, the output (i.e., the signal SEL_VMAX2) of the level shifter 116 is provided to the NOR gate 304 at the set input 120 of the state latch 118. The other two input signals of the NOR gate 304 are the output of the NAND gate 802 and the output of the NAND gate 601. An output of the NOR gate 304 is provided to the inverter 306. The output of the inverter 306 at the first output 128 of the state latch 118 is a signal ON_GM. The signal ON_GM is further provided back to a first input of the AND gate 802. The signal ON_GDB at the node 162 is provided to a second input (i.e., the second feedback input 126 of the state latch 118) of the AND gate 802. The signal SDB_VMAX2 is provided to a third input of the AND gate 802. In other words, the three input signals of the AND 802 gate are the signal ON_GM, the signal ON_GDB and the signal SDB_VMAX2. The signal ON_GDB is provided, along with the signal SD_VMAX2, to the AND gate 601. Feeding back the signal ON_GDB to the AND gate 601 forms a portion of a third loop 816.

On the other hand, the output of the inverter 136 is provided to the NOR gate 310 at the reset input 122 of the state latch 118. The other two input signals of the NOR gate 310 are the output of the NAND gate 808 and the output of the NAND gate 607. An output of the NOR gate 310 is provided, along with the signal VDD_RDYB, to the NOR gate 312. The output of the NOR gate 312 at the second output 130 of the state latch 118 is a signal ON_GD. The signal ON_GD is further provided back to a first input of the AND gate 808. The signal ON_GMB at the node 148 is provided to a second input (i.e., the second feedback input 124 of the state latch 118) of the AND gate 808. The signal SDB_VMAX2 is provided to a third input of the AND gate 808. In other words, the three input signals of the AND gate are the signal ON_GD, the signal ON_GMB and the signal SDB_VMAX2. The signal ON_GMB is provided, along with the signal SD_VMAX2, to the AND gate 607. Feeding back the signal ON_GMB to the AND gate 607 forms another portion of the third loop 816.

During a function mode, a first loop 178 may carry out the make-before-break function as described above. During the shutdown period, as described above, the signal SDB_VMAX2 is constantly logical low (0), whereas the signal ON_GMB and the signal ON_GDB are both constantly logical high (1), as shown in FIG. 8. Therefore, during the shutdown period, the first loop 178 is broken, thereby preventing power noise from the signal ON_GDB and the signal ON_GMB after the shutdown wakeup. In a case where the AON-SELSRM_IN state is different from the final AON_SELSRM_IN state (i.e., the AON-SELSRM_IN state changes during the shutdown period), the third loop functions to prevent make-before-break action during wake up, thereby preventing inadvertent activation of the power headers 164 and/or 150. Because the AON-SELSRM_IN signal is allowed to change state during shutdown, the output latch 166 is also allowed to change the state of the output signal AON-SELSRM_OUT based on the ON_GD and ON_GM signals received at the input of the output latch 166.

Figure 10:
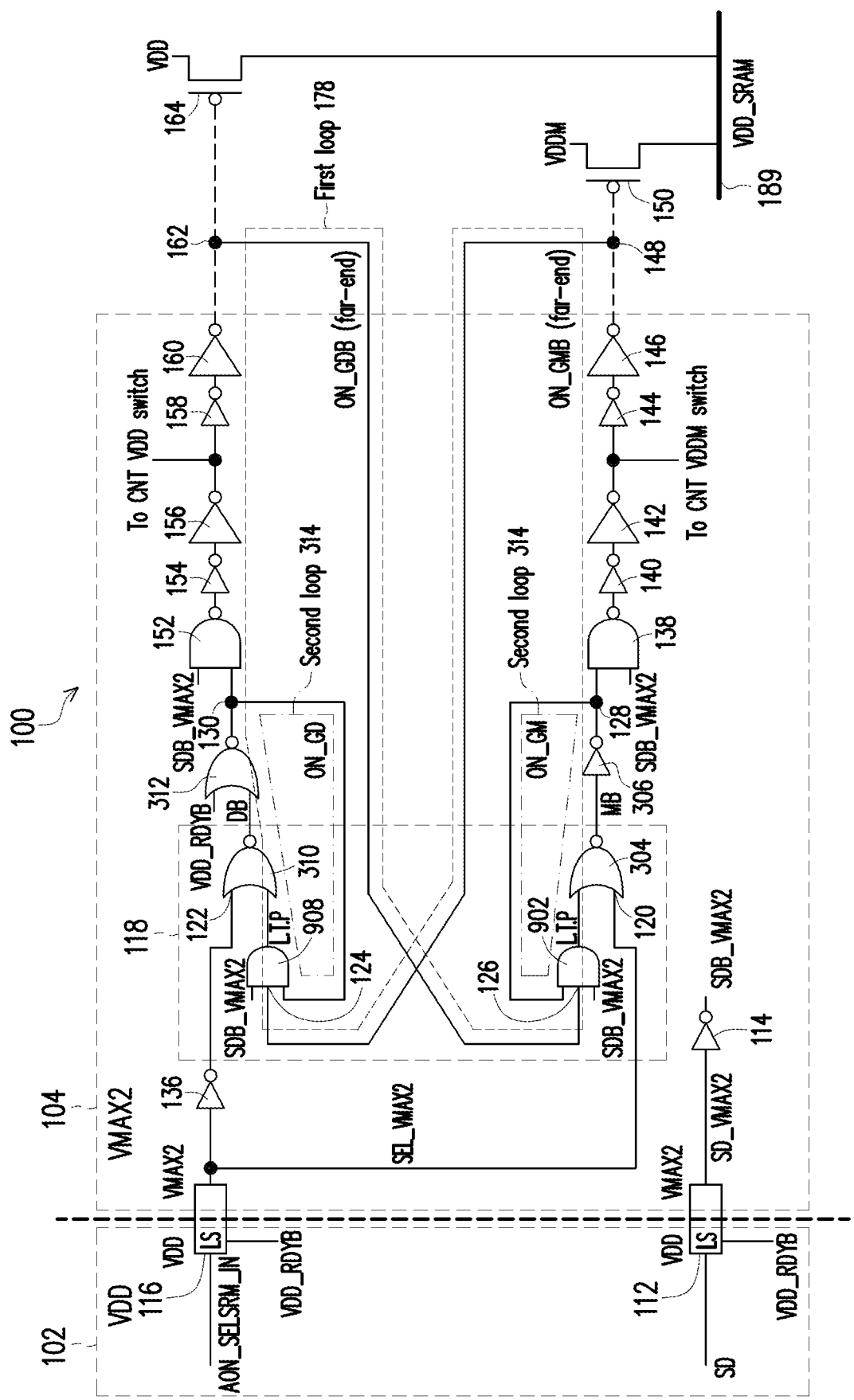
FIG. 10 is a circuit diagram illustrating another example of the first latch circuit of the power switch control circuit of FIG. 2 in accordance with some embodiments.

FIG. 10 illustrates another embodiment similar to that shown in FIG. 4A, where the AND gates 302 and 308 are replaced with AND gates 902, 908, which each include a third input that receives the SDB_VMAX2 signal. Since the SDB_VMAX2 signal is at logic low during shutdown, both the first loop 178 and the second loop 314 are turned off during shutdown. Accordingly, in the embodiment of FIG. 10, the ON_GD and ON_GM signals continue to control the output latch state as with the embodiment shown in FIG. 9.

Figure 11:
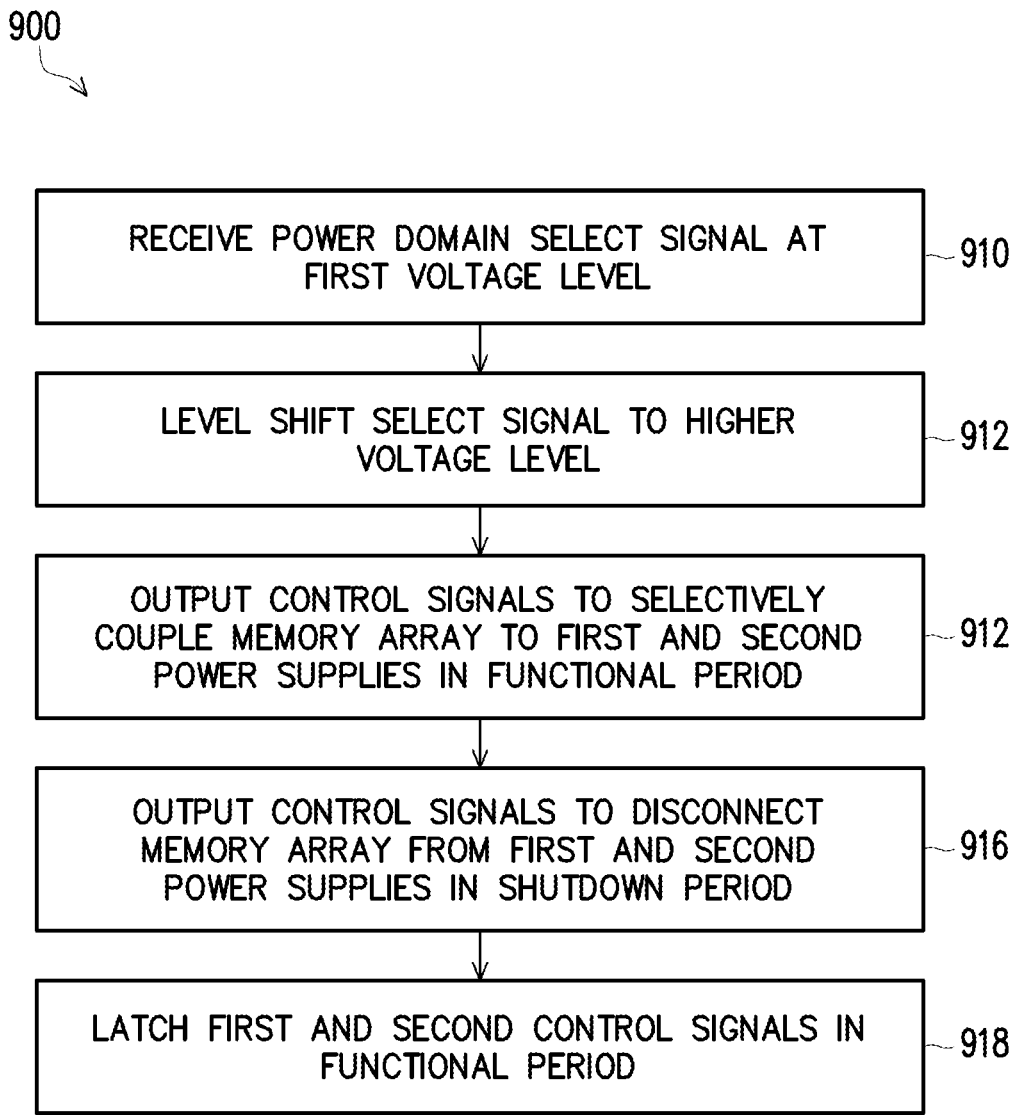
FIG. 11 is a flow diagram illustrating a method in accordance with some embodiments.

FIG. 11 is a flow diagram illustrating an example of a method 900 for operating header switches of a memory device, such as the device 10 shown in FIG. 1. A power domain select signal at a first voltage level, such as the first power domain VDD, is received at step 910, and the select signal is level shifted to a higher voltage level, such as the third power domain VMAX2, at step 912. In some examples, this is accomplished by the level shifter 116. Control signals ON_GD, ON_DM are output in the third power domain VMAX2 to first and second header switches 164, 150 to selectively couple a memory array 183 to first and second power supplies, respectively, in response to the select signal during a functional period at step 914. At step 916, the control signals in the third power domain VMAX2 are output to the first and second header switches to disconnect the memory array from both the first and the second power supplies during a shutdown period. The first and second control signals are latched during the functional period in step 918.

In accordance with some disclosed embodiments, a power switch control circuit includes a supply rail configured to supply power to a memory array, a first header switch for coupling the supply rail to a first power supply corresponding to a first power domain, a second header switch for coupling the supply rail to a second power supply corresponding to a second power domain, and a control circuit configured to receive a select signal and a shutdown signal, and to output control signals to the first and second header switches to selectively couple the first and second header switches to the first and second power supplies, respectively, in response to the select signal and the shutdown signal. The control circuit is configured to output the control signals to the first and second header switches to disconnect both the first and second header switches from the first and second power supplies in response to the shutdown signal and irrespective of the select signal.

In accordance with further embodiments, a memory device includes a bitcell array configured to operate in a first power domain or a second power domain, a wordline driver coupled to the bitcell array, an input/output circuit coupled to the bitcell array, and a supply rail coupled to the bitcell array. A first header switch selectively couples the supply rail to a first power supply corresponding to the first power domain A second header switch selectively couples the supply rail to a second power supply corresponding to the second power domain. A control circuit is configured to receive a select signal and a shutdown signal. The control circuit includes a first latch circuit configured to output control signals to the first and second header switches to selectively couple the first and second header switches to the first and second power supplies, respectively, in response to the select signal and the shutdown signal. A second latch circuit receives the first and second control signals and is configured to latch the select signal in response to the shutdown signal.

In accordance with further embodiments, a method includes receiving a shutdown signal in a first power domain, and level shifting the shutdown signal to a third power domain. Control signals are output in the third power domain to first and second header switches to selectively couple a memory array to first and second power supplies, respectively, in response to the select signal during a functional period. The control signals are output in the third power domain to first and second header switches to disconnect the memory array from both the first and the second power supplies during a shutdown period. The first and second control signals are latched during the functional period.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power switch control circuit, comprising:
    a supply rail configured to supply power to a memory array;
    a first header switch for coupling the supply rail to a first power supply corresponding to a first power domain;
    a second header switch for coupling the supply rail to a second power supply corresponding to a second power domain; and
    a control circuit comprising a first latch circuit and a second latch circuit connected in series;
    wherein the first latch circuit is configured to receive a select signal and a shutdown signal, and to output control signals to the first and second header switches to selectively couple the supply rail to the first and second power supplies, respectively, in response to the select signal and the shutdown signal during a functional period; and to output the control signals to the first and second header switches to disconnect the supply rail from the first and second power supplies in response to the shutdown signal and irrespective of the select signal during a shutdown period; and
    wherein the second latch circuit is configured to latch the control signals during the functional period.

2. The power switch control circuit of claim 1, further comprising a level shifter configured to receive the select signal and the shutdown signal in the first power domain and output the select signal and the shutdown signal in a third power domain.

3. The power switch control circuit of claim 1, further comprising:
    a plurality of the first header switches configured to sequentially couple the supply rail to the first power supply in response to the select signal; and
    a plurality of the second header switches each configured sequentially couple the supply rail to the second power supply in response to the select signal.

4. The power switch control circuit of claim 1, wherein the control signals include first and second control signals for controlling the first and second header switches, respectively;
    the first latch circuit is configured to receive the select signal and to output the first and second control signals in response thereto; and
    wherein the power switch control circuit is configured to modify one of the first or second control signals output by the first latch circuit in response to the shutdown signal.

5. The power switch control circuit of claim 4, further comprising:
    a first branch configured to generate the first control signal;
    a second branch configured to generate the second control signal; and
    a first feedback loop, wherein the first control signal is fed back to a first feedback input of the second branch, and the second control signal is fed back to a first feedback input of the first branch.

6. The power switch control circuit of claim 5, further comprising:
    a second feedback loop, wherein the first control signal is fed back to a second feedback input of the first branch, and the second control signal is fed back to a second feedback input of the second branch.

7. The power switch control circuit of claim 6, wherein the first latch includes:
    a first NOR gate in the first branch having a first input, a second input, and an output, the first input configured to receive a complement of the select signal, the output configured to output the first control signal;
    a first AND gate having the first and second feedback inputs of the first branch, and an output coupled to the second input of the first NOR gate;
    a second NOR gate in the second branch having a first input, a second input, and an output, the first input configured to receive the select signal, the output configured to output the second control signal; and
    a second AND gate having the first and second feedback inputs of the second branch, and an output coupled to the second input of the second NOR gate.

8. The power switch control circuit of claim 7, further comprising:
    a first NAND gate having a first input configured to receive a complement of the shutdown signal, a second input configured to receive the first control signal, and an output configured to output the first control signal;
    a second NAND gate having a first input configured to receive the complement of the shutdown signal, a second input configured to receive the second control signal, and an output configured to output the second control signal.

9. The power switch control circuit of claim 4, wherein the shutdown signal includes a first state corresponding to the shutdown period and a second state corresponding to the functional period, and wherein the second latch circuit is configured to receive the first and second control signals from the first latch, and to latch the select signal in response to the shutdown signal in the shutdown period, and to latch the select signal in response to the first and second control signals in the functional period.

10. The power switch control circuit of claim 7, further comprising:
    a third AND gate having a first input configured to receive the complement of the select signal, a second input configured to receive the shutdown signal, and an output coupled to the first input of the first NOR gate;
    a second NOR gate in the second branch having a first input, a second input, and an output, the first input configured to receive the select signal, the output configured to output the second control signal; and a fourth AND gate having a first input configured to receive the select signal, a second input configured to receive the shutdown signal, and an output coupled to the first input of the second NOR gate.

11. The power switch control circuit of claim 7, further comprising:
   a third AND gate having a first input configured to receive a complement of the second control signal, a second input configured to receive the shutdown signal, and an output coupled to a third input of the first NOR gate;
   a fourth AND gate having a first input configured to receive a complement of the first control signal, a second input configured to receive the shutdown signal, and an output coupled to a third input of the second NOR gate.

12. The power switch control circuit of claim 7, wherein the first AND gate includes a third input configured to receive the shutdown signal, and the second AND gate includes a third input configured to receive the shutdown signal.

13. A memory device, comprising:
   a bitcell array configured to operate in a first power domain or a second power domain;
   a wordline driver coupled to the bitcell array;
   an input/output circuit coupled to the bitcell array;
   a supply rail coupled to the bitcell array;
   a first header switch for coupling the supply rail to a first power supply corresponding to the first power domain;
   a second header switch for coupling the supply rail to a second power supply corresponding to the second power domain;
   a control circuit configured to receive a select signal and a shutdown signal, the control circuit including:
      a first latch circuit configured to output control signals to the first and second header switches to,
         selectively couple the supply rail to the first and second power supplies, respectively, in response to the select signal and the shutdown signal during a functional period; and
         disconnect the supply fail from the first and second power supplies in response to the shutdown signal and irrespective of the select signal during a shutdown period; and
      a second latch circuit connected in series with the first latch circuit to receive the control signals and configured to latch the select signal in response to the shutdown signal during the functional period.

14. The memory device of claim 13, wherein the first latch circuit is configured to output the control signals to the first and second header switches.

15. The memory device of claim 13, wherein the first latch circuit is configured to latch the select signal in response to the shutdown signal and the select signal.

16. The memory device of claim 13, further comprising a level shifter configured to receive the select signal and the shutdown signal in the first power domain and output the select signal and the shutdown signal in a third power domain.

17. The memory device of claim 16, wherein the second latch circuit is configured to output the latched select signal in the first power domain.

18. A method, comprising:
   receiving a power domain select signal at a first voltage level;
   level shifting the select signal to a higher voltage level;
   outputting control signals at the higher voltage level to first and second header switches to selectively couple a memory array to first and second power supplies, respectively, in response to the select signal during a functional period;
   outputting the control signals at the higher voltage level to the first and second header switches to disconnect the memory array from both the first and the second power supplies during a shutdown period; and
   latching the first and second control signals during the functional period.

19. The method of claim 18, wherein the first and second control signals are latched during the functional period by a first latch circuit, the method further comprising latching the select signal at the first voltage level by a second latch circuit.

20. The method of claim 19, further comprising varying the latched select signal in response to variations in the received select signal during the shutdown mode.

* * * * *

UNITED STATES PATENT AND TRADEMARK OFFICE
CERTIFICATE OF CORRECTION

| | | |
|---|---|---|
| PATENT NO. | : 11,133,039 B2 | Page 1 of 1 |
| APPLICATION NO. | : 16/594779 | |
| DATED | : September 28, 2021 | |
| INVENTOR(S) | : Yang et al. | |

It is certified that error appears in the above-identified patent and that said Letters Patent is hereby corrected as shown below:

In the Drawings

Sheet 11, Fig. 11, Line 7, delete the second occurrence of the reference numeral "912" and insert -- 914 --.

In the Specification

Column 12, Line 53, after "domain" insert -- . --.

In the Claims

Column 15, Line 40, in Claim 13, delete "fail" and insert -- rail --.

Signed and Sealed this
Seventeenth Day of May, 2022

Katherine Kelly Vidal
Director of the United States Patent and Trademark Office